United States Patent
Lin et al.

(10) Patent No.: US 11,453,593 B2
(45) Date of Patent: *Sep. 27, 2022

(54) ORIENTED GRAPHENE SHEET-ENHANCED VAPOR-BASED HEAT TRANSFER DEVICE AND PROCESS FOR PRODUCING SAME

(71) Applicant: Global Graphene Group, Inc., Dayton, OH (US)

(72) Inventors: Yi-jun Lin, Taoyuan (TW); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 553 days.

This patent is subject to a terminal disclaimer.

(21) Appl. No.: 16/397,295

(22) Filed: Apr. 29, 2019

(65) Prior Publication Data
US 2020/0339423 A1    Oct. 29, 2020

(51) Int. Cl.
*F28D 15/00* (2006.01)
*C01B 32/184* (2017.01)
(Continued)

(52) U.S. Cl.
CPC .......... *C01B 32/184* (2017.08); *C01B 32/198* (2017.08); *C01B 32/225* (2017.08);
(Continued)

(58) Field of Classification Search
CPC ..... C01B 32/184; C01B 32/23; C01B 32/198; C01B 32/225; C01B 2204/04; C01B 2204/24; F28D 15/046; H04B 1/08
(Continued)

(56) References Cited

U.S. PATENT DOCUMENTS

| | | |
|---|---|---|
| 2,798,878 A | 7/1957 | Hummers |
| 5,095,404 A | 3/1992 | Chao |

(Continued)

FOREIGN PATENT DOCUMENTS

| | | |
|---|---|---|
| WO | 2009023051 A1 | 2/2009 |
| WO | 2015132250 A1 | 9/2015 |

OTHER PUBLICATIONS

U.S. Appl. No. 16/395,800 Final Office Action dated Aug. 25, 2020, 7 pages.

(Continued)

*Primary Examiner* — Davis D Hwu

(57) ABSTRACT

Provided is a vapor-based heat transfer apparatus (e.g. a vapor chamber or a heat pipe), comprising: a hollow structure having a hollow chamber enclosed inside a sealed envelope or container made of a thermally conductive material, a wick structure in contact with one or a plurality of walls of the hollow structure, and a working liquid within the hollow structure and in contact with the wick structure, wherein the wick structure comprises a graphene material and the hollow structure walls comprise an evaporator wall having a first surface plane and a condenser wall having a second surface plane, wherein multiple sheets of the graphene material in the wick structure are aligned to be substantially parallel to one another and perpendicular to at least one of the first surface plane and the second surface plane. Also provided is a process for producing this apparatus.

15 Claims, 5 Drawing Sheets

(51) Int. Cl.
    *C01B 32/198*    (2017.01)
    *C01B 32/225*    (2017.01)
    *H04B 1/04*      (2006.01)
    *H04B 1/08*      (2006.01)
    *C01B 32/23*     (2017.01)
    *H05K 7/20*      (2006.01)
    *F28D 15/04*     (2006.01)

(52) U.S. Cl.
    CPC ............ *C01B 32/23* (2017.08); *F28D 15/046* (2013.01); *H04B 1/04* (2013.01); *H04B 1/08* (2013.01); *H05K 7/20336* (2013.01); *C01B 2204/04* (2013.01); *C01B 2204/24* (2013.01)

(58) Field of Classification Search
    USPC .................................................... 165/104.26
    See application file for complete search history.

(56) References Cited

U.S. PATENT DOCUMENTS

| | | | |
|---|---|---|---|
| 7,028,759 | B2 | 4/2006 | Rosenfeld et al. |
| 9,646,735 | B2 | 5/2017 | Adamson et al. |
| 2002/0064618 | A1 | 5/2002 | McCullough |
| 2004/0118553 | A1 | 6/2004 | Krassowski et al. |
| 2005/0067689 | A1 | 3/2005 | Hedler et al. |
| 2008/0248275 | A1 | 10/2008 | Jang et al. |
| 2009/0032227 | A1* | 2/2009 | Krassowski .......... C04B 41/009 165/104.26 |
| 2010/0085713 | A1 | 4/2010 | Balandin et al. |
| 2010/0128439 | A1 | 5/2010 | Tilak et al. |
| 2010/0140792 | A1 | 6/2010 | Haddon et al. |
| 2011/0108978 | A1 | 5/2011 | Kim et al. |
| 2014/0224466 | A1 | 8/2014 | Lin et al. |
| 2014/0345843 | A1 | 11/2014 | Kirkor et al. |
| 2014/0377160 | A1 | 12/2014 | Mukasyan et al. |
| 2018/0272565 | A1 | 9/2018 | Zhamu et al. |
| 2020/0340757 | A1* | 10/2020 | Lin .................... H05K 7/20318 |

OTHER PUBLICATIONS

U.S. Appl. No. 16/395,800 Final Office Action dated Jan. 11, 2021, 7 pages.

U.S. Appl. No. 16/397,284 Nonfinal Office Action dated Jan. 8, 2021, 13 pages.

* cited by examiner

ORIENTED GRAPHENE SHEET-ENHANCED VAPOR-BASED HEAT TRANSFER DEVICE AND PROCESS FOR PRODUCING SAME

FIELD

The present disclosure relates to the art of heat transfer devices and, in particular, to a graphene-enabled vapor chamber or heat pipe for heat spreading.

BACKGROUND

Advanced thermal management materials are becoming more and more critical for today's microelectronic, photonic, and photovoltaic systems. As new and more powerful chip designs and light-emitting diode (LED) systems are introduced, they consume more power and generate more heat. This has made thermal management a crucial issue in today's high performance systems. Systems ranging from active electronically scanned radar arrays, web servers, large battery packs for personal consumer electronics, widescreen displays, and solid-state lighting devices all require high thermal conductivity materials that can dissipate heat more efficiently. Furthermore, many microelectronic devices (e.g. smart phones, flat-screen TVs, tablets, and laptop computers) are designed and fabricated to become increasingly smaller, thinner, lighter, and tighter. This further increases the difficulty of thermal dissipation. Actually, thermal management challenges are now widely recognized as the key barriers to industry's ability to provide continued improvements in device and system performance.

Heat sinks are components that facilitate heat dissipation from the surface of a heat source, such as a CPU or battery in a computing device, to a cooler environment, such as ambient air. Typically, heat transfer between a solid surface and the air is the least efficient within the system, and the solid-air interface thus represents the greatest barrier for heat dissipation. A heat sink is designed to enhance the heat transfer efficiency between a heat source and the air mainly through increased heat sink surface area that is in direct contact with the air. This design enables a faster heat dissipation rate and thus lowers the device operating temperatures.

A vapor-based heat transfer apparatus comprises a hollow structure and a working liquid within the hollow structure. A vapor chamber is a closed structure having an empty space inside within which a liquid is provided. Vapor chambers are typically passive, two-phase (liquid-vapor) heat transport loops that are used to spread heat from relatively small, high heat-flux sources to a region of larger area where the heat can be transferred elsewhere at a significantly lower heat-flux.

A standard heat pipe transfers heat along the axis of the pipe and, thus, is well-suited to cooling discrete heat sources. Vapor chambers are suitable for collecting heat from larger-area heat sources and then spreading the heat or conducting the heat to a heat sink for cooling. Vapor chambers are useful for heat spreading in two dimensions, particularly where high powers and heat fluxes are applied to a relatively small evaporator area. During operation of a vapor chamber, the heat transferred from a heat source to the evaporator can vaporize the liquid within the evaporator wick. The vapor can flow throughout the chamber, serving as an isothermal heat spreader. The vapor then condenses on the condenser surfaces, where the heat may be removed by forced convection, natural convection, liquid cooling, etc. (e.g. through a heat sink). The condensed liquid is transported back to the evaporator via capillary forces in the wick.

Materials for vapor-based heat transfer apparatus (e.g. heat pipe or vapor chamber) must be thermally conducting. Typically, a heat pipe or vapor chamber is made from a metal, especially copper or aluminum, due to the ability of metal to readily transfer heat across its entire structure. However, there are several major drawbacks or limitations associated with the use of metallic chambers. One drawback relates to the relatively low thermal conductivity of a metal (<400 W/mK for Cu and 80-200 W/mK for Al alloy). In addition, the use of copper or aluminum heat transfer apparatus can present a problem because of the weight of the metal, particularly when the heating area is significantly smaller than that of the heat sink. For instance, pure copper weighs 8.96 grams per cubic centimeter (g/cm$^3$) and pure aluminum weighs 2.70 g/cm$^3$. In many applications, several vapor chambers or heat pipes need to be arrayed on a circuit board to dissipate heat from a variety of components on the board. If metallic pipes or chambers are employed, the sheer weight of the metal on the board can increase the chances of the board cracking or of other undesirable effects, and increases the weight of the component itself. Many metals do not exhibit a high surface thermal emissivity and thus do not effectively dissipate heat through the radiation mechanism.

Thus, there is a strong need for a heat pipe or vapor chamber that contains a reduced amount of metal and is effective for dissipating heat produced by a heat source such as a CPU and battery in a device. The heat transfer system should exhibit a higher thermal conductivity and/or a higher thermal conductivity-to-weight ratio as compared to metallic heat sinks. These heat transfer apparatus must also be mass-producible, preferably using a cost-effective process.

SUMMARY

The present disclosure provides a vapor-based heat transfer apparatus (e.g. a heat pipe or a vapor chamber), comprising (a) a hollow structure made of a thermally conductive material having a thermal conductivity no less than 5 W/mK, more preferably no less than 10 and further more preferably no less than 20 W/mK (e.g. most preferably greater than 50 W/mK or even >100 W/mK, such as Cu, Al, etc.), (b) a wick structure in contact with one or a plurality of walls of the hollow structure, and (c) a working liquid within the hollow structure and in contact with the wick structure, wherein the wick structure comprises a graphene material (herein referred to as the first graphene material).

In certain preferred embodiments, a plurality of walls of the hollow structure comprise an evaporator wall having a first surface plane, and a condenser wall, having a second surface plane wherein multiple graphene sheets of the first graphene material are aligned to be substantially parallel to one another and perpendicular to at least one of the first surface plane and the second surface plane.

In certain embodiments, the first graphene material comprises graphene sheets selected from pristine graphene, CVD graphene, graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

In some embodiments, the first graphene material comprises graphene powder particles that are bonded together or bonded to the one or a plurality of hollow structure walls by a binder or adhesive. In some embodiments, the first graphene material comprises a graphene composite having graphene sheets dispersed in a matrix selected from polymer, carbon, glass, ceramic, organic, or metal.

In some embodiments, the first graphene material comprises a graphene-containing coating or paint comprising graphene sheets dispersed in an adhesive and the adhesive is bonded to the one or a plurality of hollow structure walls.

In some preferred embodiments, the first graphene material comprises a layer of graphene foam having pores and graphene-containing pore walls and the graphene foam has a physical density from 0.001 to 1.8 g/cm$^3$. In some embodiments, the first graphene material comprises a layer of graphene paper, graphene film, graphene mat, or graphene membrane.

In some preferred embodiments, the first graphene material comprises graphene-coated metal particles, graphene-coated ceramic particles, graphene-coated carbon particles, graphene-coated glass particles, graphene-coated polymer particles, metal-decorated graphene sheets, ceramic-decorated graphene sheets, or a combination thereof.

The working fluid may contain a fluid selected from water, methyl alcohol, acetone, propylene glycol, refrigerant, ammonia, or alkali metal selected from cesium, potassium or sodium.

Preferably, the thermally conductive material used to construct the hollow structure has a thermal conductivity no less than 100 W/mK. In some embodiments, the thermally conductive material contains a material selected from Cu, Al, steel, Ag, Au, Sn, W, Zn, Ti, Ni, Pb, solder, boron nitride, boron arsenide, diamond, gallium arsenide, aluminum nitride, silicon nitride, or a combination thereof.

The apparatus may further comprise one or more extended structures configured to dissipate heat from the apparatus to an ambient environment, wherein the extended structure has a finned heat sink structure. The apparatus may be physically connected to a heat sink or a cooling system.

In some embodiments, the thermally conductive material that constitutes the hollow structure contains a second graphene material. In some preferred embodiments, the second graphene material comprises graphene sheets selected from pristine graphene, CVD graphene, graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

In some embodiments, the second graphene material comprises a graphene composite having graphene sheets dispersed in a matrix selected from polymer, carbon, glass, ceramic, organic, or metal.

The disclosure also provides a vapor-based heat transfer apparatus, comprising (a) a hollow structure made of a thermally conductive graphene material having a thermal conductivity no less than 5 W/mK, (b) a wick structure in contact with one or a plurality of walls of said hollow structure, and (c) a working liquid within said hollow structure and in contact with said wick structure.

In this apparatus, the thermally conductive graphene material and/or the wick structure comprises graphene selected from pristine graphene, CVD graphene, graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

In some preferred embodiments, the thermally conductive graphene material that constitutes the hollow structure comprises a graphene paper, graphene film, graphene membrane, or a graphene composite having graphene sheets dispersed in a matrix selected from polymer, carbon, glass, ceramic, organic, or metal. The metal matrix is preferably selected from Cu, Al, steel, Ag, Au, Sn, W, Zn, Ti, Ni, Pb, solder, or a combination thereof. The ceramic matrix is preferably selected from boron nitride, boron arsenide, diamond, gallium arsenide, aluminum nitride, silicon nitride, or a combination thereof.

The apparatus may further comprise an adhesive that hermetically seals the graphene paper, graphene film, graphene membrane, or graphene composite.

The disclosure also provides a microelectronic, photonic, or photovoltaic system containing the invented vapor-based heat transfer apparatus as a heat dissipating device.

Also provided is a process for producing the wick structure in the invented heat transfer apparatus, the process comprising: (a) preparing a graphene dispersion having multiple graphene sheets dispersed in a liquid; (b) subjecting the graphene dispersion to a forced assembly procedure, forcing the multiple graphene sheets to assemble into a liquid-impregnated laminar graphene structure, wherein the multiple graphene sheets are alternately spaced by thin layers of liquid (preferably <10 nm in thickness); and (c) removing the liquid or solidifying the liquid to become a solid wick structure, wherein the multiple graphene sheets in the wick structure are aligned to be substantially parallel to one another and perpendicular to at least one of the first surface plane and the second surface plane.

In certain embodiments, the step of solidifying the liquid comprises polymerizing and/or curing a reactive monomer or resin to form a polymer or a cured resin solid, or cooling the liquid to below a melting point to form a solid.

In some embodiments, the forced assembling and orientating procedure includes introducing the graphene dispersion, having an initial volume $V_1$, in a mold cavity cell and driving a piston into the mold cavity cell to reduce the graphene dispersion volume to a smaller value $V_2$, allowing excess liquid to flow out of the cavity cell and aligning the graphene sheets along a desired direction.

In some embodiments, the forced assembling and orientating procedure includes introducing the graphene dispersion in a mold cavity cell having an initial volume $V_1$, and applying a suction pressure through a porous wall of the mold cavity to reduce graphene dispersion volume to a smaller value $V_2$, allowing excess liquid to flow out of the cavity cell through the porous wall and aligning the graphene sheets along a desired direction.

In some embodiments, the forced assembling and orientating procedure includes introducing a first layer of the graphene dispersion onto a surface of a supporting conveyor and driving the layer of graphene dispersion supported on the conveyor through at least a pair of pressing rollers to reduce a thickness of the graphene dispersion layer and align the graphene sheets along a direction parallel to the conveyor surface for forming a layer of liquid-impregnated graphene sheets.

The process may further include a step of introducing a second layer of the graphene dispersion onto a surface of the layer of liquid-impregnated graphene sheets to form a two-layer structure, and driving the two-layer structure through at least a pair of pressing rollers to reduce a thickness of the second layer of graphene dispersion and align the graphene sheets along a direction parallel to the conveyor surface for forming a layer of liquid-impregnated graphene sheets.

In certain embodiments, the process further includes a step of compressing or roll-pressing the liquid-impregnated graphene sheets to reduce a thin liquid layer thickness in the impregnated graphene sheets, improve orientation of graphene sheets, and squeeze excess liquid out of the impregnated graphene sheets.

In some preferred embodiments, the process is a roll-to-roll process wherein the forced assembling and orientating procedure includes feeding the supporting conveyor, in a continuous film form, from a feeder roller to a deposition zone, continuously or intermittently depositing the graphene dispersion onto a surface of the supporting conveyor film to form a layer of liquid-impregnated graphene sheets thereon, and collecting the layer of liquid-impregnated graphene sheets supported on conveyor film on a collector roller.

DETAILED DESCRIPTION OF PREFERRED EMBODIMENTS

The present disclosure provides a vapor-based heat transfer apparatus (e.g. a heat pipe or a vapor chamber, as schematically shown in FIG. 2), comprising (a) a hollow structure comprising a thermally conductive material having a thermal conductivity preferably no less than 5 W/mK and further preferably no less than 10 W/mK (e.g. Cu, Al, etc.), (b) a wick structure in contact with one or a plurality of walls of the hollow structure, and (c) a working liquid within the hollow structure and in contact with the wick structure, wherein the wick structure comprises a graphene material.

Figure 2A:
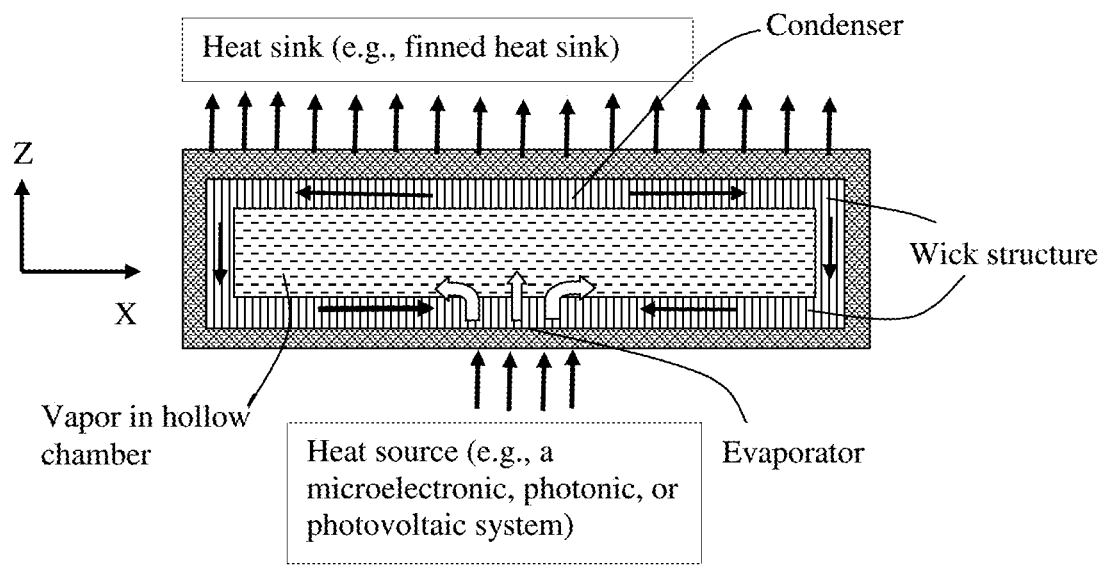
FIG. 2(A) Schematic of a vapor chamber having a graphene-based wick structure.

The heat coming from a heat source (below the hollow structure in FIG. 2(A)) is conducted through the lower portion (evaporator) of the hollow structure to vaporize the working fluid in or near the wick structure, (in what may be called evaporative surfaces of the wick structure near the heat source). The vapor may quickly fill the chamber of the hollow structure, serving as an isothermal heat spreader; some of the vapor comes in contact with the upper portion of the hollow structure and get condensed on the wick structure, (in what may be called condenser surfaces of the wick structure near the heat sink). The condensed fluid (e.g. water) flows back to the lower portion (hotter portion) through the wick structure via capillary forces in the wick. The returned liquid continues to get vaporized provided the heat source continues to pump heat into the chamber. It should be understood that the heat source may include any type of heat source, including such examples as a controller/processor or any type of integrated circuit, any type of electronics, microelectronic system, photonic system, photovoltaic system, or anything else for which it is desirable to remove heat therefrom.

Figure 2B:
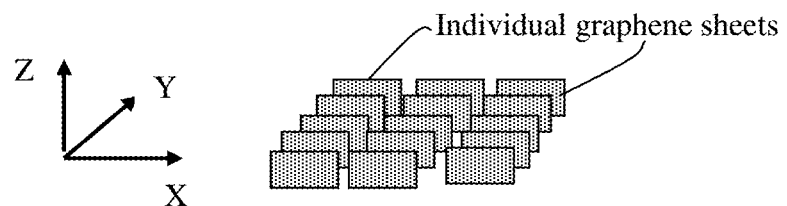
FIG. 2(B) Preferred orientation (alignment) direction for the graphene sheets in the evaporator zone or condenser zone of the wick structure.

In certain preferred embodiments, as illustrated in FIG. 2(B), the graphene sheets in the evaporator zone or condenser zone of the wick structure are preferentially aligned parallel to X-Z plane directions. These graphene sheets are substantially parallel to one another and perpendicular to the surface plane of the evaporator portion of the chamber wall (or perpendicular to the surface plane of the wick structure). Such an orientation of graphene sheets enables faster heat transfer from the heat source to the evaporator region and faster transport of condensed liquid returning back to the evaporator zone of the wick structure via capillary forces.

A first type of wick structure may contain a sintered body of particles (e.g. graphene-coated Cu particles) having some surface pores or internal pores. This type of wick structure offers the highest degree of versatility in terms of power handling capacity and ability to work against gravity. A second type of wick structure may contain a mesh screen, which is less expensive to manufacture and allows the heat pipe or vapor chamber to be thinner relative to a sintered wick. However, due to the capillary force of the screen being significantly less than that of a sintered wick, its ability to work against gravity or handle higher heat loads is lower. The third type of a wick structure is a grooved wick whose cost and performance is the lowest of the three. The grooves may act as an internal fin structure aiding in the evaporation and condensation.

The graphene material used in the wick structure is herein referred to as the first graphene material. The thermally conductive material used in the hollow structure may also comprise a graphene material (herein referred to as the second graphene material). The first graphene material and the second graphene material may be the same or different in composition. In the presently invented vapor-based heat transfer apparatus, either the wick structure or the hollow structure (or both) may comprise a graphene material.

In certain embodiments, the first or second graphene material comprises graphene sheets selected from pristine graphene, CVD graphene (e.g. CVD graphene coated on Cu, Ni, Fe films), graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

In some embodiments, the first or second graphene material comprises a graphene paper, graphene film, graphene membrane, or a graphene composite having graphene sheets dispersed in a matrix selected from polymer, carbon, glass, ceramic, organic, or metal.

The production of isolated graphene sheets, graphene sheet-reinforced composites, graphene paper, graphene film, graphene membrane, or graphene foam, each as a material, is well-known in the art. This will be briefly described as follows:

Carbon is known to have five unique crystalline structures, including diamond, fullerene (0-D nanographitic material), carbon nano-tube or carbon nano-fiber (1-D nanographitic material), graphene (2-D nanographitic material), and graphite (3-D graphitic material). The carbon nano-tube (CNT) refers to a tubular structure grown with a single wall or multi-wall. Carbon nano-tubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nanographite material.

Bulk natural graphite powder is a 3-D graphitic material with each graphite particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another. This presents a problem as explained below:

A graphite single crystal (crystallite) per se or a crystalline grain in a graphite particle is anisotropic with a property measured along a direction in the basal plane (crystallographic a- or b-axis direction) being dramatically different than if measured along the crystallographic c-axis direction (thickness direction). For instance, the thermal conductivity of a graphite single crystal can be up to approximately 1,920 W/mK (theoretical) or 1,800 W/mK (experimental) in the basal plane (crystallographic a- and b-axis directions), but that along the crystallographic c-axis direction is less than 10 W/mK (typically less than 5 W/mK). Furthermore, there are large amounts of highly deficient boundaries between grains that impede the movement of electrons and phonons (quantized lattice vibrations), the two heat conduction mechanisms according to quantum mechanics. Consequently, a natural graphite particle composed of multiple grains of different orientations with highly defected grain boundaries exhibits an average property between these two extremes. This average conductivity, typically less than 200 W/mK, is insufficient for microelectronic device heat dissipation applications.

One approach to overcoming this problem is to make use of flexible graphite foil. The flexible graphite foil is obtained by the following typical steps: (a) intercalating particles of natural graphite with an intercalant (e.g. mixture of sulfuric acid and nitric acid) to form a graphite intercalation compound (GIC); (b) exposing the GIC to a thermal shock treatment (typically 650°-1,100° C.) to produce exfoliated graphite (also referred to as graphite worms); and then (c) compressing or roll-pressing exfoliated graphite worms into paper-like sheets or foil.

A new class of nano carbon material is graphene, a 2-D material having a hexagonal arrangement of carbon atoms. These honeycomb-like carbon atoms can form a free standing sheet that is one-atom thick, which is now commonly referred to as a single-layer graphene sheet. Several layers of graphene planes can be bonded together to form a multi-layer graphene sheet or platelets, which contain less than 300 graphene planes or layers (or thinner than 100 nm), preferably less than 20 layers, and further preferably less than 10 layers (few-layer graphene). In both single-layer graphene and multi-layer graphene sheets, the graphene planes or edges can contain some non-carbon elements, such as hydrogen, oxygen, nitrogen, and fluorine, to name just a few. All these single-layer or multi-layer graphene sheets (0.24 nm to 100 nm thick) are herein collectively referred to as nanographene platelets (NGPs).

Multiple sheets of a graphene material (e.g. discrete nano sheets or platelets of pristine graphene, graphene oxide, reduced graphene oxide, graphene fluoride, nitrogenated graphene, hydrogenated graphene, boron-doped graphene, etc.) can be packed into a film, membrane, or paper sheet. These aggregates typically do not exhibit a high thermal conductivity unless these sheets/platelets are closely packed and the film/membrane/paper is ultra-thin (e.g. <1 µm, which is mechanically weak). This is reported in our earlier U.S. patent application Ser. No. 11/784,606 (Apr. 9, 2007) (U.S. Pat. Pub. No. 2008/0248275). In general, a paper-like structure or mat made from platelets of graphene, graphene oxide (GO), or reduced graphene oxide (RGO) (e.g. those paper sheets prepared by vacuum-assisted filtration process) exhibit many defects, wrinkled or folded graphene sheets, interruptions or gaps between platelets, and non-parallel platelets, leading to relatively low thermal conductivity, low electric conductivity, and low structural strength.

Our earlier application (U.S. application Ser. No. 11/784, 606) also disclosed a mat, film, or paper of graphene sheets infiltrated with a metal, glass, ceramic, resin, and CVD carbon matrix material (graphene sheets/platelets being the filler or reinforcement phase). Haddon, et al. (US Pub. No. 2010/0140792, Jun. 10, 2010) also reported graphene thin films and graphene-reinforced polymer matrix composites for thermal management applications. The graphene-reinforced polymer matrix composites, as an intended thermal interface material, have low thermal conductivity, typically <<2 W/mK. The graphene films of Haddon, et al are essentially non-woven aggregates of discrete graphene platelets, identical to those of our earlier disclosure (U.S. application Ser. No. 11/784,606). Again, these aggregates also exhibit low thermal conductivity unless made into thin films (10 nm-300 nm, as reported by Haddon, et al) which are very difficult to handle in a real device manufacturing environment. Balandin, et al (US Pub. No. 2010/0085713, Apr. 8, 2010) disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal infiltrated graphene sheets.

A nanographene platelet (NGP) or graphene sheet is essentially composed of a graphene plane (hexagonal lattice of carbon atoms) or multiple graphene planes stacked and bonded together (typically up to 10 graphene planes per multi-layer platelet). Each graphene plane, also referred to as a graphene sheet, comprises a two-dimensional hexagonal structure of carbon atoms. Each platelet has a length and a width parallel to the graphene plane and a thickness orthogonal to the graphene plane. By definition, the thickness of an NGP can be 100 nanometers (nm) or smaller (preferably containing no greater than 10 hexagonal planes), with a single-sheet NGP, also referred to as single-layer graphene, being as thin as 0.34 nm.

Figure 1:
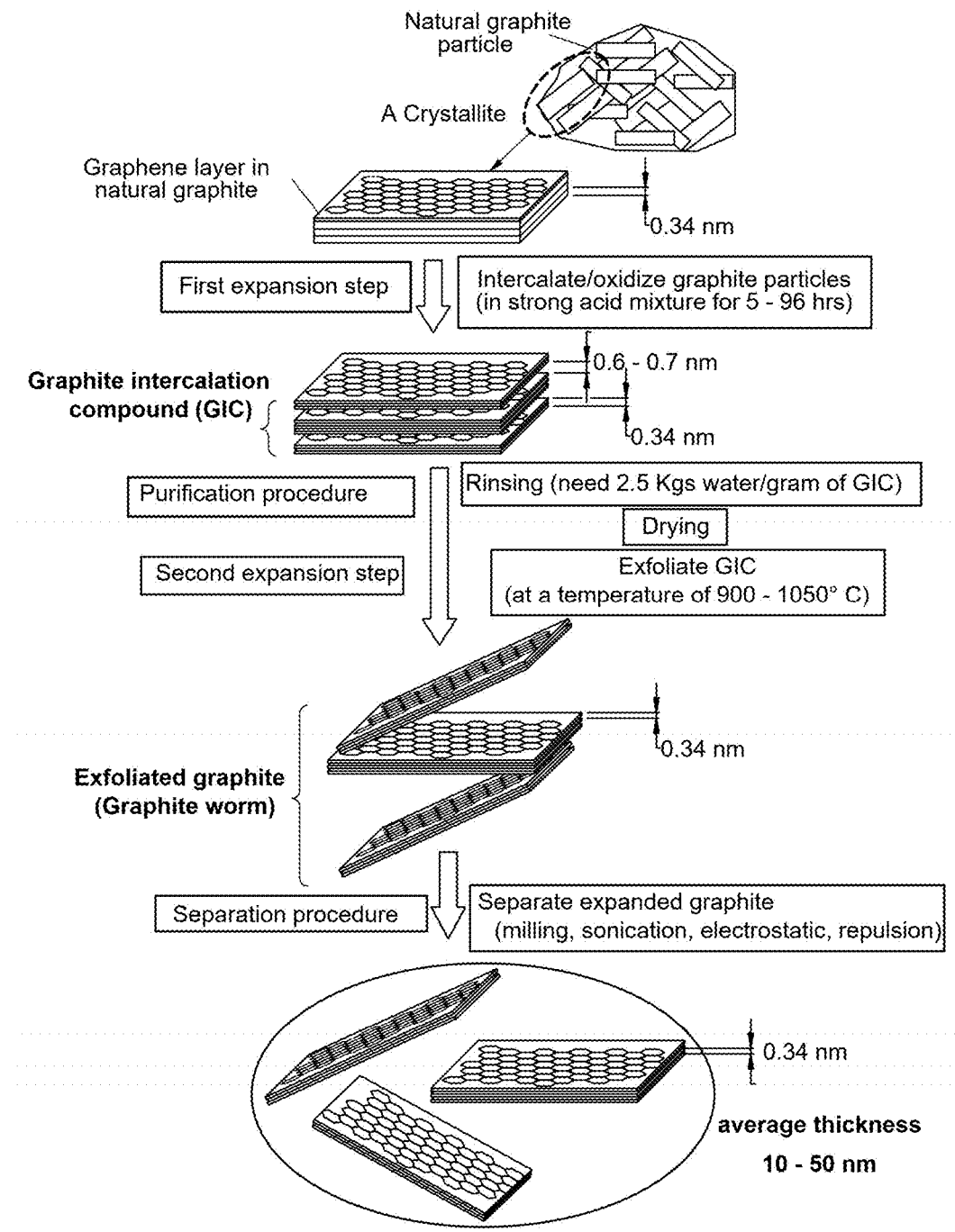
FIG. 1 A flow chart showing the most commonly used process of producing highly oxidized graphene sheets.

Currently, the most commonly used method of graphene production is the so-called chemical method, as illustrated in FIG. 1. This method entails chemical intercalation or oxidation of natural graphite or synthetic graphite particles. These particles are essentially already in the fully graphitized state. Prior to intercalation or oxidation, the graphite particle has an inter-graphene plane spacing as small as approximately 0.335 nm ($L_d=\frac{1}{2}d_{002}=0.335$ nm). Due to the short-range force nature of van der Waals forces, the bonding between graphene planes is very strong, making it difficult for any chemical species to intercalate into the inter-graphene spaces. Hence, it normally takes a combination of a strong acid (e.g. sulfuric acid) and a strong oxidant (e.g. potassium permanganate or nitic acid) and a long reaction time to achieve full chemical intercalation or oxidation of graphite to produce the graphite intercalation compound (GIC) or graphite oxide (GO). With an intercalation and oxidation treatment, the inter-graphene spacing is increased to a value typically greater than 0.6 nm. This is the first expansion stage experienced by the graphite material during this chemical route. The obtained GIC or GO is then subjected to further expansion (often referred to as exfoliation) using either a thermal shock exposure or a solution-based, ultrasonication-assisted graphene layer exfoliation approach.

In the thermal shock exposure approach, the GIC or GO is exposed to a high temperature (typically 800-1,050° C.) for a short period of time (typically 15 to 60 seconds) to exfoliate or expand the GIC or GO for the formation of exfoliated or further expanded graphite, which is typically in the form of a "graphite worm" composed of graphite flakes that are still interconnected with one another. This thermal shock procedure can produce some separated graphite flakes or graphene sheets, but normally the majority of graphite flakes remain interconnected. Typically, the exfoliated graphite or graphite worm is then subjected to a flake separation treatment using air milling, mechanical shearing, or ultrasonication in water to produce graphene sheets.

As such, this approach basically entails three distinct procedures: first expansion (oxidation or intercalation), further expansion (or "exfoliation"), and separation. The resulting GO or RGO sheets are then coated, heat-treated, and compacted into a thin film.

Graphene may be coated onto surfaces of Cu, Ni, Fe films, etc. using chemical vapor deposition (CVD). The CVD graphene-coated metal films may be used as a wick structure, a hollow structure, or an integral wick-hollow structure wherein the CVD graphene serves as a wick structure and the metal films as the basic thermally conductive material of a hollow structure in a vapor chamber or heat pipe.

The present disclosure provides a process for producing a highly oriented (aligned), adhesive-impregnated laminar graphene structure for use as a wick electrode or as a vapor chamber/heat pipe hollow structure. This adhesive may be initially in a liquid state (e.g. uncured resin, metal melt, pitch, etc.), but becomes solidified after the wick structure or hollow structure element is made. In some embodiments, the process comprises: (a) preparing a graphene dispersion having multiple graphene sheets dispersed in (or impregnated with) a liquid; (b) subjecting the graphene dispersion to a forced assembly procedure, forcing the multiple graphene sheets to assemble into the liquid-impregnated laminar graphene structure, wherein the multiple graphene sheets are alternately spaced by thin liquid layers, less than 10 nm (preferably <5 nm) in thickness, and the multiple graphene sheets are substantially aligned along a desired direction, and wherein the laminar graphene structure has a physical density from 0.5 to 1.6 g/cm$^3$ (more typically 0.7-1.3 g/cm$^3$) and a specific surface area from 50 to 3,300 m$^2$/g, when measured in a dried state of the laminar structure without the presence of the liquid; and (c) removing/drying the liquid or solidifying the liquid to become a solid (e.g. polymerizing and/or curing a reactive monomer or resin to form a polymer or cured resin solid; or cooling the liquid to below the melting point to form a solid).

In some desired embodiments, the forced assembly procedure includes introducing a graphene dispersion, having an initial volume $V_1$, in a mold cavity cell and driving a piston into the mold cavity cell to reduce the graphene dispersion volume to a smaller value $V_2$, allowing excess liquid to flow out of the cavity cell (e.g. through holes of the mold cavity cell or of the piston) and aligning the multiple graphene sheets along a direction at an angle from 0° to 90° relative to a movement direction of the piston. The liquid may be intended to be an adhesive or simply a fluid medium to facilitate the flow of graphene sheets.

Figure 3A:
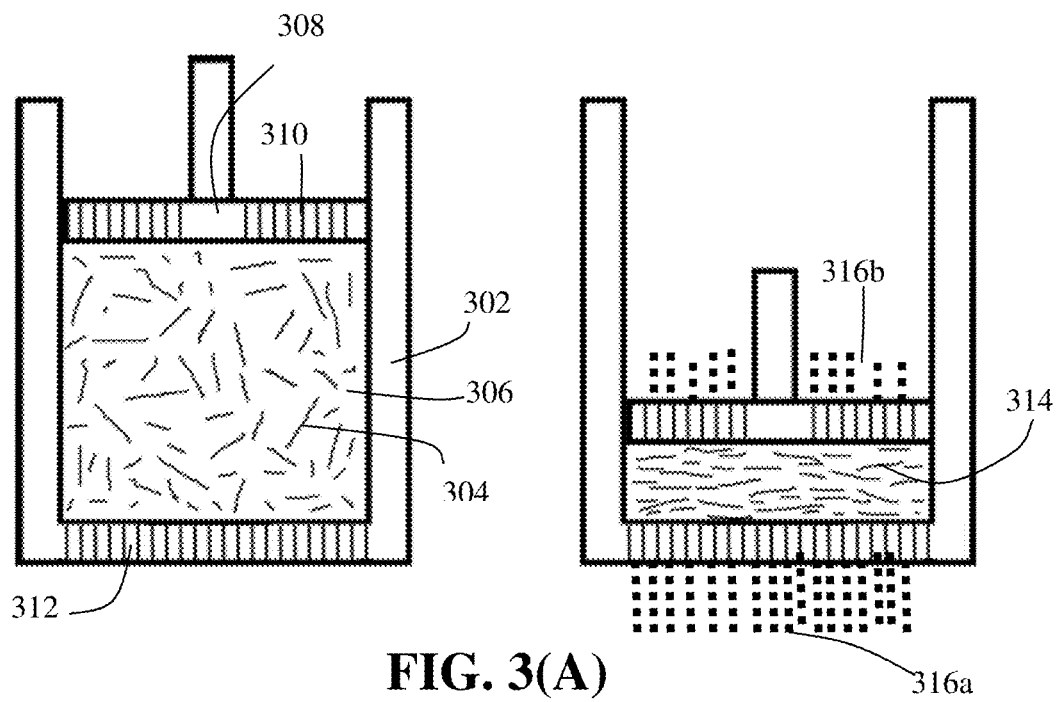
FIG. 3(A) Schematic drawing to illustrate an example of a compressing and consolidating operation (using a mold cavity cell equipped with a piston or ram) for forming a layer of highly compacted and oriented graphene sheets. Graphene sheets are aligned parallel to the bottom plane or perpendicular to the layer thickness direction.

FIG. 3(A) provides a schematic drawing to illustrate an example of a compressing and consolidating operation (using a mold cavity cell 302 equipped with a piston or ram 308) for forming a layer of highly compacted and oriented graphene sheets 314. Contained in the chamber (mold cavity cell 302) is a dispersion (e.g. suspension or slurry that is composed of graphene sheets 304 randomly dispersed in a liquid 306). As the piston 308 is driven downward, the volume of the dispersion is decreased by forcing excess liquid to flow through minute channels 312 on a mold wall or through small channels 310 of the piston. These small channels can be present in any or all walls of the mold cavity and the channel sizes can be designed to permit permeation of the liquid, but not the solid graphene sheets (typically 0.5-10 µm in length or width). The excess liquid is shown as 316a and 316b on the right diagram of FIG. 3(A). As a result of this compressing and consolidating operation, graphene sheets 314 are aligned parallel to the bottom plane or perpendicular to the layer thickness direction.

In this dispersion, if so desired, practically each and every isolated graphene sheet is surrounded by the liquid (e.g. adhesive) that is physically adsorbed on or chemically bonded to graphene sheet surface. During the subsequent consolidating and aligning operation, isolated graphene sheets remain isolated or separated from one another through liquid (e.g. adhesive). Upon removal of the excess liquid, graphene sheets remain spaced apart by liquid adhesive and this liquid adhesive-filled space can be as small as 0.4 nm.

Figure 3B:
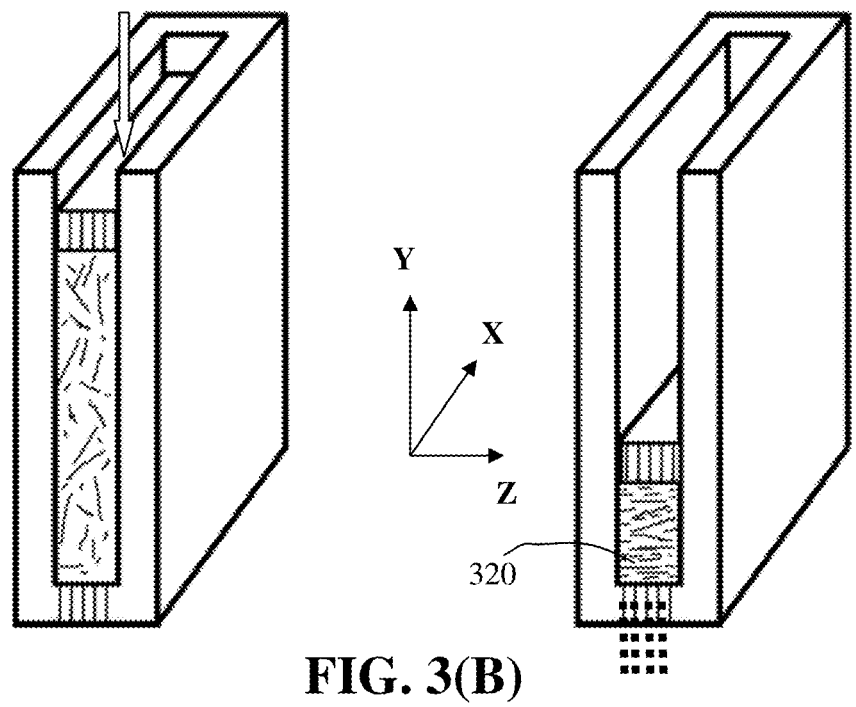
FIG. 3(B) Schematic drawing to illustrate another example of a compressing and consolidating operation (using a mold cavity cell equipped with a piston or ram) for forming a layer of highly compacted and oriented graphene sheets. Graphene sheets are aligned perpendicular to the side plane (X-Y plane) or parallel to the layer thickness direction (Z direction).

Shown in FIG. 3(B) is a schematic drawing to illustrate another example of a compressing and consolidating operation (using a mold cavity cell equipped with a piston or ram) for forming a layer of highly compacted and oriented graphene sheets 320. The piston is driven downward along the Y-direction. The graphene sheets are aligned on the X-Z plane and perpendicular to X-Y plane (along the Z- or thickness direction). This layer of oriented graphene sheets, as a wick structure, can be attached to a hollow structure interior surface that is basically represented by the X-Y plane. In the resulting hollow chamber structure, graphene sheets (e.g. in an evaporator portion) are aligned perpendicular to the evaporator plane. Such an orientation is conducive to a faster heat transfer from a heat source to the evaporator portion of the wick structure and, hence, leads to a faster vaporization of the working fluid as compared to the corresponding evaporator structure featuring graphene sheets being randomly oriented or aligned parallel to the evaporator plane.

Figure 3C:
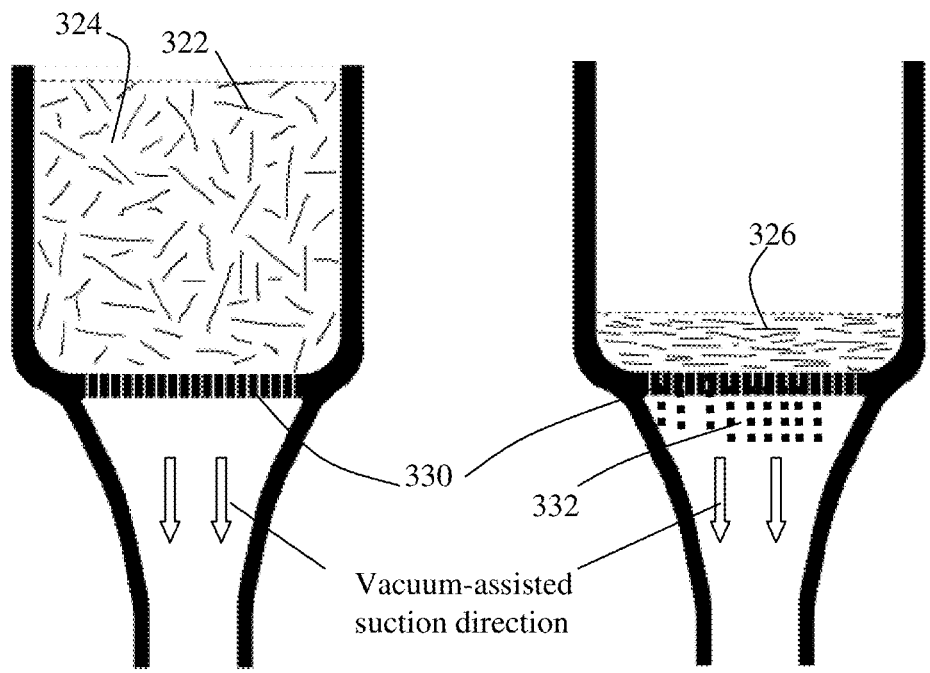
FIG. 3(C) Schematic drawing to illustrate yet another example of a compressing and consolidating operation (using a mold cavity cell with a vacuum-assisted suction provision) for forming a layer of highly compacted and oriented graphene sheets. Graphene sheets are aligned parallel to the bottom plane or perpendicular to the layer thickness direction. Preferably, the resulting layer of liquid-impregnated laminar graphene sheets structure is further compressed to achieve an even high tap density.

FIG. 3(C) provides a schematic drawing to illustrate yet another example of a compressing and consolidating operation (using a mold cavity cell with a vacuum-assisted suction provision) for forming a layer of highly compacted and oriented graphene sheets 326. The process begins with dispersing isolated graphene sheets 322 and an optional filler in a liquid 324 to form a dispersion. This is followed by generating a negative pressure via a vacuum system that sucks excess liquid 332 through channels 330. This compressing and consolidating operation acts to reduce the dispersion volume and align all the isolated graphene sheets on the bottom plane of a mold cavity cell. Compacted graphene sheets are aligned parallel to the bottom plane or perpendicular to the layer thickness direction. Preferably, the resulting layer laminar graphene sheet structure is further compressed to achieve an even high tap density.

Thus, in some desired embodiments, the forced assembly procedure includes introducing dispersion of graphene sheets in a mold cavity cell having an initial volume $V_1$, and applying a suction pressure through a porous wall of the mold cavity to reduce the graphene dispersion volume to a smaller value $V_2$, allowing excess liquid to flow out of the cavity cell through the porous wall and aligning the multiple graphene sheets along a direction at an angle from approximately 0° to approximately 90° relative to a suction pressure direction; this angle depending upon the inclination of the bottom plane with respect to the suction direction.

Figure 3D:
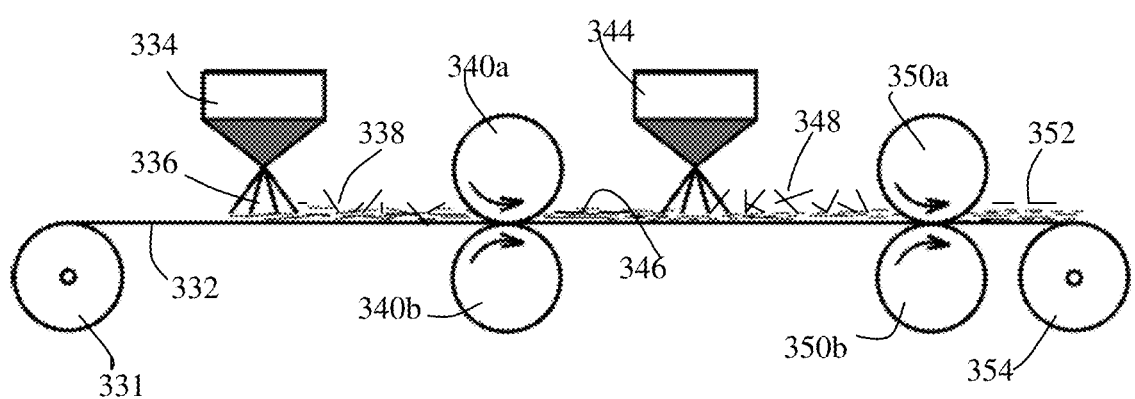
FIG. 3(D) A roll-to-roll process for producing a thick layer of liquid-impregnated laminar graphene structure. Graphene sheets are well-aligned on the supporting substrate plane.

FIG. 3(D) shows a roll-to-roll process for producing a thick layer of adhesive-impregnated (or un-impregnated) laminar graphene sheet structure. This process begins by feeding a continuous solid substrate 332 (e.g. PET film or stainless steel sheet) from a feeder roller 331. A dispenser 334 is operated to dispense dispersion 336 of isolated graphene sheets and liquid onto the substrate surface to form a layer of deposited dispersion 338, which feeds through the gap between two compressing rollers, 340a and 340b, to form a layer of liquid-impregnated, highly oriented graphene sheets. The graphene sheets are well-aligned on the supporting substrate plane. If so desired, a second dispenser 344 is then operated to dispense another layer of dispersion 348 on the surface of the previously consolidated dispersion layer. The two-layer structure is then driven to pass through the gap between two roll-pressing rollers 350a and 350b to form a thicker layer 352 of liquid-impregnated laminar graphene sheet structure, which is taken up by a winding roller 354. In certain embodiments, the liquid is removed; but in other the liquid (e.g. adhesive) stays in the spaces between graphene sheets.

Thus, in some preferred embodiments, the forced assembly procedure includes introducing a first layer of the graphene dispersion onto a surface of a supporting conveyor and driving the layer of graphene suspension supported on the conveyor through at least a pair of pressing rollers to reduce the thickness of the graphene dispersion layer and align the multiple graphene sheets along a direction parallel to the conveyor surface for forming a layer of liquid-impregnated laminar graphene structure.

The process may further include a step of introducing a second layer of the graphene dispersion onto a surface of the layer of liquid-impregnated laminar structure to form a two layer laminar structure, and driving the two-layer laminar structure through at least a pair of pressing rollers to reduce a thickness of the second layer of graphene dispersion and align the multiple graphene sheets along a direction parallel to the conveyor surface for forming a layer of liquid-impregnated laminar structure. The same procedure may be repeated by allowing the conveyor to move toward a third set of pressing rollers, depositing additional (third) layer of graphene dispersion onto the two-layer structure, and forcing the resulting 3-layer structure to go through the gap between the two rollers in the third set to form a further compacted, liquid-impregnated laminar graphene sheet structure.

The above paragraphs about FIG. 3(A)-FIG. 3(D) are but four of the many examples of possible apparatus or processes that can be used to produce liquid-impregnated laminar graphene sheet strictures that contain highly oriented and closely packed graphene sheets spaced by thin layers of liquid. This liquid may be removed/dried during any stage of compressing or consolidating. The liquid (if containing an adhesive, for instance) may be allowed to stay in the spaces between graphene sheets.

Figure 4:
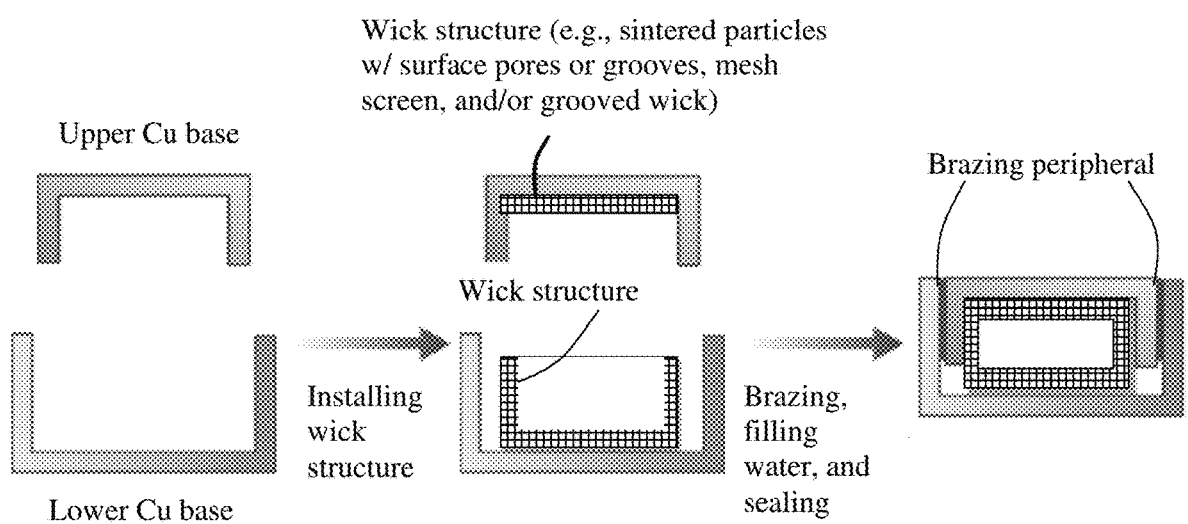
FIG. 4 An example of vapor chamber/heat pipe production processes.

There are many feasible ways of producing the invented vapor-based heat transfer device. For instance, as schematically illustrated in FIG. 4, one may prepare two members of a hollow structure (e.g. an upper Cu base and a lower Cu base), install the two mating portions of a graphene-based wick structure, fit and braze the two members together, fill the working fluid (e.g. water), and seal the gaps to form the desired vapor chamber. The two upper and lower bases may be produced from a graphene-reinforced Cu/Sn alloy or polymer using injection molding or compression molding. The wick structures may contain graphene film, graphene foam, graphene paper, compacted graphene-coated Cu particles, etc. There can be supporting spacers between the upper and the lower members of the hollow structure.

A first type of wick structure may contain a sintered body of particles having some surface pores or grooves. This type of wick structure offers the highest degree of versatility in terms of power handling capacity and ability to work against gravity. A second type of wick structure may contain a mesh screen, which is less expensive to manufacture and allows the heat pipe or vapor chamber to be thinner relative to a sintered wick. However, due to the capillary force of the screen being significantly less than a sintered wick, its ability to work against gravity or handle higher heat loads is lower. The third type of a wick structure is a grooved wick whose cost and performance is the lowest of the three. The grooves may act as an internal fin structure aiding in the evaporation and condensation. Any suitable wick structure could be used. Further, a graphene-filled adhesive can be employed, and may be used in a coating or paint.

During operation of a vapor chamber, the heat transferred from a heat source to the evaporator can vaporize the liquid within the evaporator wick. The presence of a graphene-based chamber wall structure and/or graphene-based wick structure enables significantly faster heat transfer from the heat source to the evaporator portion of the wick structure, allowing for more efficient evaporation of the working fluid. The vapor can flow throughout the chamber, serving as an isothermal heat spreader. The vapor then condenses on the condenser surfaces, where the heat may be removed by forced convection, natural convection, liquid cooling, etc. [e.g. through a heat sink (such as is shown in FIG. 2(A), which may include an extended structure such as a finned heat sink)]. The condensed liquid is transported back to the evaporator via capillary forces in the wick. The graphene material can be chemically treated to make graphene surfaces favorable or conducive to wetting and movement of the condensed working fluid.

We have observed that the presently invented graphene material-based wick structure enables a vapor chamber to deliver 2.0-3.5 times higher maximum heat flux in comparison with a vapor chamber of the same dimensions but featuring a conventional Cu-based wick structure. For instance, one can easily achieve a maximum heat flux of >>2,000 W/cm$^2$ (over an area of 4 cm$^2$) for a vapor chamber having an optimized graphene-based wick having highly oriented graphene sheets. The heat flux value is even significantly higher if a graphene-reinforced Cu hollow chamber wall is implemented. Any microelectronic, photonic, or photovoltaic system may be made to contain the invented vapor-based heat transfer apparatus as a heat dissipating device to help keep the system cool.

The following examples serve to provide the best modes of practice for the presently disclosed process and should not be construed as limiting the scope of the process:

Example 1: Production of Graphene Sheets (GO and RGO) Via Hummer's Process and Preparation of Graphene Paper as a Wick Structure Graphite oxide as prepared by oxidation of graphite flakes with sulfuric acid, nitrate, and permanganate according to the method of Hummers [U.S. Pat. No. 2,798,878, Jul. 9, 1957]. Upon completion of the reaction, the mixture was poured into deionized water and filtered. The graphite oxide was repeatedly washed in a 5% solution of HCl to remove most of the sulfate ions. The sample was then washed repeatedly with deionized water until the pH of the filtrate was neutral. The slurry was spray-dried and stored in a vacuum oven at 60° C. for 24 hours. The interlayer spacing of the resulting laminar graphite oxide was determined by the Debey-Scherrer X-ray technique to be approximately 0.73 nm (7.3 Å). This material was subsequently transferred to a furnace pre-set at 650° C. for 4 minutes for exfoliation and heated in an inert atmosphere furnace at 1200° C. for 4 hours to create a low density powder comprised of few-layer reduced graphene oxide (RGO). Surface area was measured via nitrogen adsorption BET.

The RGO sheets were made into wick structures using both the presently invented processes (wick structure containing oriented graphene sheets, perpendicular to the evaporator plane; prepared according to a procedure as illustrated in FIG. 3(C)) and the conventional production process (graphene paper and composites of resin-bonded expanded graphite sheets). Resin-bonded/sealed graphene sheets were also used in a hollow chamber structure in a vapor chamber device. Cu based wick and hollow structures were also prepared for comparison purposes.

Example 2: Preparation of Single-Layer Graphene Sheets from Meso-Carbon Micro-Beads (MCMBs)

Meso-carbon microbeads (MCMBs) were supplied from China Steel Chemical Co., Kaohsiung, Taiwan. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 48-96 hours. Upon completion of the reaction, the mixture was poured into deionized water and filtered. The intercalated MCMBs were repeatedly washed in a 5% solution of HCl to remove most of the sulfate ions. The sample Was then washed repeatedly with deionized water until the pH of the filtrate was no less than 4.5. The slurry was then subjected ultrasonication for 10-100 minutes to produce GO suspensions.

TEM and atomic force microscopic studies indicate that most of the GO sheets were single-layer graphene when the oxidation treatment exceeded 72 hours, and 2- or 3-layer graphene when the oxidation time was from 48 to 72 hours.

The GO sheets contain oxygen proportion of approximately 35%-47% by weight for oxidation treatment times of 48-96 hours. GO sheets were suspended in water and slightly reduced with NaBO$_4$ to form RGO sheets. A portion of the RGO sample was dispersed in a UV-curable liquid adhesive to form a dispersion. Part of the dispersion was compressed and consolidated into a layer of adhesive-impregnated, compacted and highly oriented RGO sheets (adhesive-impregnated laminar graphene structure) according to the process illustrated in FIG. 3(A). This was bonded to an evaporator portion and a condenser portion of a Cu-based hollow chamber with the graphene sheets aligned parallel to the evaporator plane. Other part of the dispersion was made into a layer of adhesive-impregnated laminar structure having graphene sheets aligned perpendicular to the evaporator plane, according to a procedure as illustrated in FIG. 3(B). The adhesive was subsequently cured after the respective wick structures (with a parallel or a perpendicular orientation) were attached to the interior wall surfaces of a vapor chamber.

Example 3: Preparation of Pristine Graphene Sheets (0% Oxygen) and Solid Graphene Films Recognizing the possibility of the high defect population in GO sheets acting to reduce the conductivity of individual graphene plane, we decided to study if the use of pristine graphene sheets (non-oxidized and oxygen-free, non-halogenated and halogen-free, etc.) can lead to a graphene film having a higher thermal conductivity. Pristine graphene sheets were produced by using the direct ultrasonication or liquid-phase production process.

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson 5450 Ultrasonicator) was used for exfoliation, separation, and size reduction of graphene sheets for a period of 15 minutes to 2 hours. The resulting graphene sheets are pristine graphene that have never been oxidized and are oxygen-free and relatively defect-free. There are no other non-carbon elements.

The pristine graphene sheets were immersed into a 10 mM acetone solution of BPO for 30 min and were then taken out drying naturally in air. The heat-initiated chemical reaction to functionalize graphene sheets was conducted at 80° C. in a high-pressure stainless steel container filled with pure nitrogen. Subsequently, the samples were rinsed thoroughly in acetone to remove BPO residues for subsequent Raman characterization. As the reaction time increased, the characteristic disorder-induced D band around 1330 cm$^{-1}$ emerged and gradually became the most prominent feature of the Raman spectra. The D-band is originated from the A$_{1g}$ mode breathing vibrations of six-membered sp$^2$ carbon rings, and becomes Raman active after neighboring sp$^2$ carbon atoms are converted to sp$^3$ hybridization. In addition, the double resonance 2D band around 2670 cm$^{-1}$ became significantly weakened, while the G band around 1580 cm$^{-1}$ was broadened due to the presence of a defect-induced D' shoulder peak at ~1620 cm$^{-1}$. These observations suggest that covalent C—C bonds were formed and thus a degree of structural disorder was generated by the transformation from sp² to sp³ configuration due to reaction with BPO.

The functionalized graphene sheets were re-dispersed in water to produce a graphene dispersion, which were then made into wick structures using the presently invented process (roll-pressing-based as illustrated in FIG. 3(C)). Water was removed during and after roll-pressing. The structures were cut and trimmed to layers having a thickness from 20 μm to 2 mm, which were used as a wick structure in a vapor chamber containing an Al-based hollow chamber wherein an external surface of this hollow chamber was deposited with a graphene/epoxy coating layer using ultrasonic spray coating.

Example 4: Preparation of Graphene-Coated Cu Particles for Use as a Wick Structure Some amount of the dried graphene powder prepared in Example 3, along with Cu particles, was poured into a ball-milling pot chamber and then ball-milled in a plenary ball milling device for 30 minutes to obtain graphene-coated Cu particles. Certain amounts of the graphene-coated Cu particles were compacted, using a compression press, to form layers of compacted graphene-coated Cu particles. Some of compacted layers were used as a wick structure in a vapor chamber. Other layers were melted and solidified to make graphene-reinforced Cu composite-based hollow structures for vapor chambers.

Example 5: Preparation of Graphene Fluoride Films

Several processes have been used by us to produce GF, but only one process is herein described as an example. In a typical procedure, highly exfoliated graphite (HEG) was prepared from intercalated compound $C_2F \cdot xClF_3$. HEG was further fluorinated by vapors of chlorine trifluoride to yield fluorinated highly exfoliated graphite (FHEG). Pre-cooled Teflon reactor was filled with 20-30 mL of liquid pre-cooled $ClF_3$, the reactor was closed and cooled to liquid nitrogen temperature. Then, no more than 1 g of HEG was put in a container with holes for $ClF_3$ gas to access and situated inside the reactor. In 7-10 days a gray-beige product with approximate formula $C_2F$ was formed.

Subsequently, a small amount of FHEG (approximately 0.5 mg) was mixed with 20-30 mL of an organic solvent (methanol or ethanol) and subjected to an ultrasound treatment (280 W) for 30 min, leading to the formation of homogeneous yellowish dispersions. The dispersions were separately made into graphene fluoride papers according to a procedure described in FIG. 3(B). The graphene fluoride paper was used as a wick structure for a vapor chamber containing non-water based working fluid.

Example 6: Preparation of Nitrogenated Graphene Sheets

Some of the graphene oxide (GO) sheets, synthesized in Example 1, were finely ground with different proportions of urea and the pelletized mixture heated in a microwave reactor (900 W) for 30 s. The product was washed several times with deionized water and vacuum dried. In this method graphene oxide gets simultaneously reduced and doped with nitrogen. The products obtained with graphene/urea mass ratios of 1/0.5, 1/1 and 1/2 have the nitrogen contents of 14.7, 18.2 and 17.5 wt. %, respectively, as found by elemental analysis. These nitrogenated graphene sheets were then compacted together (as in FIG. 3(B)) to form a layer of nitrogenated graphene powder compact (having oriented graphene sheets and surface grooves and pores), which was glued to a Cu chamber surface for use as a wick structure.

The invention claimed is:

1. A vapor-based heat transfer apparatus, comprising (a) a hollow structure comprising a thermally conductive material having a thermal conductivity no less than 5 W/mK, (b) a wick structure in contact with one or a plurality of walls of said hollow structure, and (c) a working liquid within said hollow structure and in contact with said wick structure, wherein said wick structure comprises a first graphene material and said a plurality of walls of said hollow structure comprise an evaporator wall having a first surface plane and a condenser wall having a second surface plane, wherein multiple sheets of said first graphene material in said wick structure are aligned to be substantially parallel to one another and perpendicular to at least one of said first surface plane and said second surface plane.

2. The apparatus of claim 1, wherein said first graphene material comprises graphene sheets selected from pristine graphene, CVD graphene, graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

3. The apparatus of claim 1, wherein said aligned multiple graphene sheets are dispersed in or bonded by a matrix or binder material selected from a polymer, carbon, glass, ceramic, organic, or metal.

4. A vapor-based heat transfer apparatus, comprising (a) a hollow structure comprising a thermally conductive material having a thermal conductivity no less than 5 W/mK, (b) a wick structure in contact with one or a plurality of walls of said hollow structure, and (c) a working liquid within said hollow structure and in contact with said wick structure, wherein said wick structure comprises a first graphene material and said a plurality of walls of said hollow structure comprise an evaporator wall having a first surface plane and a condenser wall having a second surface plane, wherein multiple sheets of said first graphene material in said wick structure are aligned to be substantially parallel to one another and perpendicular to at least one of said first surface plane and said second surface plane, wherein said first graphene material comprises a graphene-containing coating or paint comprising graphene sheets dispersed in an adhesive and said adhesive is bonded to an exterior surface of said hollow structure.

5. The apparatus of claim 1, wherein said working fluid contains a fluid selected from water, methyl alcohol, propylene glycol, acetone, refrigerant, ammonia, or alkali metal selected from cesium, potassium or sodium.

6. The apparatus of claim 1, wherein said thermally conductive material has a thermal conductivity no less than 100 W/mK.

7. The apparatus of claim 1, wherein said thermally conductive material contains a material selected from Cu, Al, steel, Ag, Au, Sn, W, Zn, Ti, Ni, Pb, solder, boron nitride, boron arsenide, diamond, gallium arsenide, aluminum nitride, silicon nitride, or a combination thereof.

8. The apparatus of claim 1, wherein said thermally conductive material in said hollow structure contains a second graphene material.

9. The apparatus of claim 8, wherein said second graphene material comprises graphene sheets selected from pristine graphene, graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

10. The apparatus of claim 8, wherein said second graphene material comprises a graphene composite having graphene sheets dispersed in a matrix selected from polymer, carbon, glass, ceramic, organic, or metal.

11. The apparatus of claim 1, wherein said thermally conductive material in said hollow structure comprises a graphene paper, graphene film, graphene membrane, graphene coating, or a graphene composite having graphene sheets dispersed in a matrix selected from a polymer, carbon, glass, ceramic, organic, or metal.

12. The apparatus of claim 11, further comprising an adhesive that hermetically seals said graphene paper, graphene film, graphene membrane, or graphene composite.

13. The apparatus of claim 1, further comprising one or more extended structures configured to dissipate heat from said apparatus to an ambient environment.

14. The apparatus of claim 13, wherein said extended structures contain a finned heat sink structure.

15. A microelectronic, photonic, or photovoltaic system containing said apparatus of claim 1 as a heat dissipating device.

\* \* \* \* \*